United States Patent
Khor et al.

(10) Patent No.: US 6,482,680 B1
(45) Date of Patent: Nov. 19, 2002

(54) FLIP-CHIP ON LEAD FRAME

(75) Inventors: Lily Khor, Perak (MY); Ong King Hoo, Perak (MY)

(73) Assignee: Carsem Semiconductor SDN, BHD., Perak (MY)

( * ) Notice: Subject to any disclaimer, the term of this patent is extended or adjusted under 35 U.S.C. 154(b) by 0 days.

(21) Appl. No.: 09/910,181

(22) Filed: Jul. 20, 2001

(51) Int. Cl.[7] .................... H01L 21/44; H01L 21/48; H01L 21/50

(52) U.S. Cl. .................... 438/123; 438/108; 438/119; 438/121; 438/613; 438/614; 228/180.21; 228/180.22

(58) Field of Search ................ 438/108, 119, 438/121, 123, 613, 614; 228/180.21, 180.22

(56) References Cited

U.S. PATENT DOCUMENTS

| | | | | |
|---|---|---|---|---|
| 5,492,266 A | * | 2/1996 | Hoebener et al. | 228/248.1 |
| 5,535,936 A | * | 7/1996 | Chong et al. | 228/175 |
| 5,542,601 A | * | 8/1996 | Fallon et al. | 228/119 |
| 5,849,608 A | * | 12/1998 | Abe | 438/123 |
| 6,297,142 B1 | * | 10/2001 | Mita et al. | 438/612 |
| 6,337,522 B1 | * | 1/2002 | Kang et al. | 257/784 |

\* cited by examiner

*Primary Examiner*—Kamand Cuneo
*Assistant Examiner*—David A. Zarneke
(74) *Attorney, Agent, or Firm*—Weingarten, Schurgin, Gagnebin & Lebovici LLP

(57) ABSTRACT

There is disclosed a flip-chip-type method of assembling semiconductor devices. The proposed invention offer one step encapsulation process to promote adhesion of die to the lead finger and prevent the potential of shorts from developing between the adjacent bumps (13) or lead fingers. Conventional mold compound (15) is used to reduce localized stress causes by coefficient of thermal expansion (CTE) mismatch between the die (11) and substrate, or the lead frame (12). This is particularly favorable in promoting greater mechanical robustness of the semiconductor devices. With one step encapsulation process proposed by the present invention, manufacturing process is made simpler, faster and relatively cheaper.

18 Claims, 1 Drawing Sheet

FLIP-CHIP ON LEAD FRAME

TECHNICAL FIELD OF THE INVENTION

The present invention relates generally to a method of attaching semiconductor die to lead frame, and more particularly to a flip-chip on lead frame method of attaching semiconductor die to the lead frame.

BACKGROUND OF THE INVENTION

Demand of product complexity keep increasing in an astounding rate and there is a pressing need in the industry to increase the semiconductor die size in order to add in more functionality to provide such complex products. Yet, at the same time there is also more pressing need in the industry to reduce the overall package size, especially due to miniaturization. In the past, this pressing issue has been somewhat satisfactorily resolved by utilizing the Ball Grid Array method (BGA) as a packaging solution to solve such problem. However, such BGA's method is not a cost-effective solution for assembling the low pin count lead frame-based product such as the Shrink Small Outline Package (SSOP), Small Outline Transistor (SOT) or the likes. This is mainly due to the high substrate cost in comparison to the standard lead frame cost. Consequently, many product designers have not seen transition from the generally known practice to the flip-chip technology, especially for the low pin count devices, as an economically viable option.

The process flow for flip-chip on BGA method generally involves flipping a bumped die onto a BGA substrate (normally organic or ceramic nature), underfilling, molding, ball attachment and singulation. As mentioned earlier, the relative cost of the substrate to lead frame is higher, therefore the transition of using such technique to produce low pin count devices is not particularly acceptable or popular.

Nevertheless, there is disclosed a method of fabricating flip-chip on leads devices, as in U.S. Pat. No. 5,817,540, to assembled low pin count semiconductor devices. Generally, such method is said to have provided a large and robust flip-chip type interconnections between the electric contact points and the lead frame, eliminating the need for wirebonding and for adhesive connections of the lead frame to the die active surface. The disclosed method generally comprises of the concept of flipping a die onto a lead frame with the use of bumps as interconnect. Wafer will be bumped and saw beforehand. Bumping method will be as per what is used for the current flip-chip technology. Upon separating the dies, the bumped die will be flipped directly onto the matching lead frame. Connection between the die and the lead frame is achieved through re-flowing of the solder. When solder bumps are not used as an interconnection, conductive paste or conductive-filled epoxy may also be used. In such a case, conductive paste will be deposited onto the die by silk screening or any other method known in the art. Connection will then be achieved through the curing of paste in an oven or in-line furnace, as generally known in the art. Die placement accuracy needed for this invention is ±2 mils (5.08 micrometers). After the die-to-lead frame assembly, a dielectric layer, or the under-fill material, will be dispensed to cover the gap existed between the die and the lead frame, primarily for preventing potential shorting and to further promote adhesion between the die and the lead frame. Final encapsulation is accomplished using the conventional overmold process known in the art. This method, in particular, is suitable to assemble DRAM devices.

Although the disclosed U.S. Pat. No. 5,817,540 method do offer certain advantages, it also permit potential shorting to develop between the adjacent solder bumps or lead fingers. In particular, this is due to the direct re-flow of the solder bumps onto the lead frame that causes the solder to collapse completely onto the lead frame thus giving very little or no gap between the die and the lead frame. Consequently, shorting may develop between adjacent bumps or the lead fingers in addition to the uneven under-fill or mold compound coverage. Furthermore, the difficulty to ensure consistent gap between the die and lead frame is also prevalent using this method.

The present invention seeks to provide an alternative solution to the known flip-chip on lead frame method of assembling semiconductor devices. The proposed invention generally offer one step encapsulation process to promote adhesion of die to the lead finger and prevent the potential of shorts from developing between the adjacent bumps or lead fingers. Such advantageous features may be achieved through the use of conventional mold equipment and mold compound. Generally, mold compound is used for the same purpose as under-fill in any of the flip-chip construction to reduce localized stress caused by coefficient of thermal expansion (CTE) mismatch between the die and substrate, or the lead frame. This is particularly important in promoting greater mechanical robustness of the semiconductor devices. With one encapsulation step proposed by the present invention, manufacturing process is made simpler, faster and relatively cheaper.

SUMMARY OF THE INVENTION

It is therefore an object of the present invention to provide a method of attaching a semiconductor die to a lead frame suitable for producing low pin count semiconductor devices.

It is another object of the present invention to provide a flip-chip-type method of attaching semiconductor die to a lead frame.

Yet, it is another object of the present invention to provide a single encapsulation step of packaging semiconductor devices, yet offering a substantially reduced localized stress causes by the coefficient thermal expansion mismatch.

Yet, it is another object of the present invention to provide a method of attaching semiconductor die to lead frame that is able to accommodates larger die size in a comparatively smaller packaging dimension.

These and other objects of the present invention are accomplished by providing,

A flip-chip-type method of attaching a semiconductor die (11) to a lead frame (12), comprising the steps of:
- configuring said semiconductor die (11) with a plurality of predetermined electric contact points (10) so as to accommodate connection to lead fingers of said lead frame (12);
- configuring discrete conductive element (13) over each of said predetermined electric contact points (10);
- depositing a solder element to form solder element layers (14) on said lead fingers, said solder element layers (14) are arranged at locations that match with said discrete conductive elements (13); and
- securing said semiconductor die (11) to said lead frame (12) through said electric contact points (10), said discrete conductive elements (13) and said solder element layers (14), respectively.

Preferably, the semiconductor device is encapsulated using mold compound in a single encapsulation process.

Also preferable, the method may also be adapted to assemble higher pin count semiconductor devices.

Also preferable, the solder element layers are set to melt at substantially lower temperature compared to the discrete conductive elements.

Yet, the solder element is deposited onto the lead finger through stencil printing or any other suitable methods.

Yet, it is also preferable that the solder element is deposited onto the lead fingers through selective plating.

BRIEF DESCRIPTION OF THE DRAWINGS

The embodiments of the invention will now be described, by way of example only, with reference to the accompanying figures in which.

DETAILED DESCRIPTION OF THE DRAWINGS

Figure 1:
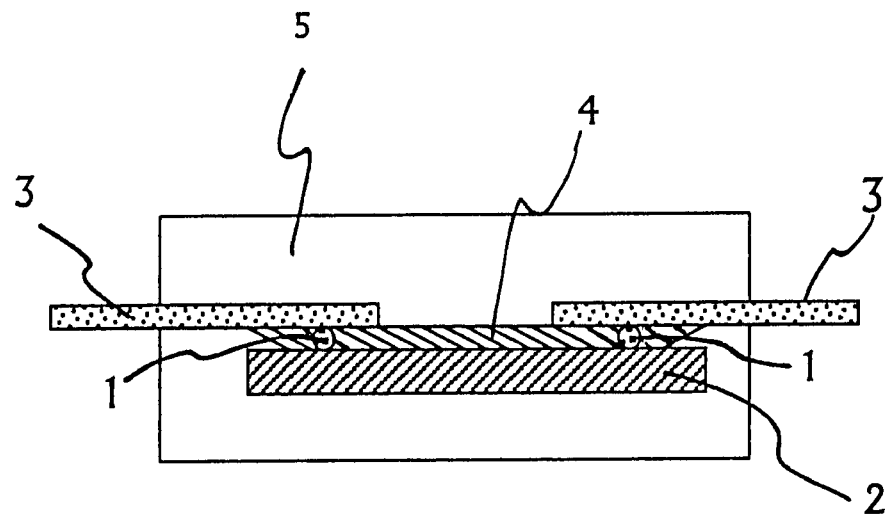
FIG. 1 shows cross-sectional view of a prior art semiconductor assembly.

Referring now to the figures, especially to FIG. 1, there is shown a cross-sectional view of the prior art semiconductor assembly, as generally disclosed in U.S. Pat. No. 5,817,540. In summary, the method offered the concept of flipping a die onto a lead frame with use of bumps (1) as interconnect, thus the term flip-chip. Semiconductor wafer will be bumped and sawed in the first place through a known method in the art. Upon separating the dies, the bumped die (2) will be flipped directly onto a matching lead frame (3). Connection between the die (2) and the lead frame (3) is achieved through re-flowing of the solder bump. When solder bumps are not used as an interconnection, conductive paste will be deposited onto the die by silk screening or any other method known in the art. Connection will then be achieved through curing of the paste in oven or in-line furnace. Die placement accuracy needed for this assembly is at ±2 mils (5.08 micrometers). After the die-to-lead frame assembly, a dielectric layer (4) which is also known as under-fill material, will be dispersed to cover the gap formed between the die and the lead frame. This is to prevent potential shorting between the lead fingers and to further promote adhesion between die and lead frame. Final encapsulation is then achieved through the conventional overmold method using mold compound (5) and equipment known in the art. As earlier discussed, such prior art method is not without its disadvantages.

Figure 2:
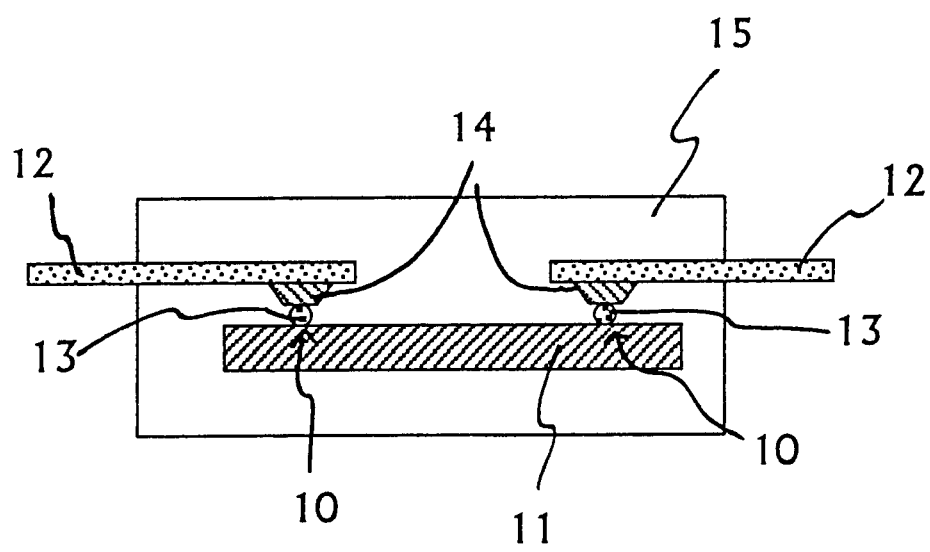
FIG. 2 shows cross-sectional view of a semiconductor assembly according to the present invention.

Referring now to FIG. 2, there is shown semiconductor assembly constructed according to the method as proposed by the present invention. In general, the method provides one step encapsulation process that is simpler, faster and cheaper compare to the known processes. Specifically, the method to assemble such semiconductor assembly is as the following steps.

Initially, semiconductor wafer (not shown) is bumped and sawed as known in the art. Such step also includes configuring a plurality of predetermined electric contact points (10) on the semiconductor die (11). The electric contact points provide interconnection points that affect connection between the circuitry within the semiconductor to its lead frame (12). A discrete conductive element (13), or solder bump, is then formed over each of the predetermined electric contact points (10). The discrete conductive element (13) or the solder bumps, formed on the semiconductor die are preferably made from a combination of alloy that will have higher melting temperature compared to a solder paste used in conjunction with the invention. Solder element, preferably eutectic solder paste, is then deposited onto the lead finger of the lead frame (12) using preferably, stencil printing process to form solder element layers (14). Stencils opening (not shown) are designed and adapted to match with solder bumps location formed on the semiconductor die. Preferably, the discrete conductive element (13) is made from a composition of 90% Pb and 10% Sn; or 95% Pb and 5% Sn; with a melting range starting at around 300° C. The solder element, or paste used is preferably composed of 63% Sn and 35% Pb which offers a melting point approximately at 183° C. Any other alloy combination may also be utilized as long as the same effect is being achieved, i.e., the solder element layers (14) melt at substantially lower temperature compared to the discrete conductive element (13), or the bumps. This is due to the desire to control the standoff height between die and the lead frame, particularly to ensure that the mold compound with its filler can flow in easily between the formed gap (not shown).

In a circumstances where deposition of solder paste cannot be executed through stencil printing process, the lead fingers of the lead frame (12) itself may be plated with equivalent alloy composition. In such a case, plating must only be formed on the tip of the lead fingers where bumps (13) will land. This may be achieved using selective plating method and could be conducted during the led frame manufacturing process. No-clean flux shall be used to hold the die in place before any connection is made to clean off any oxides on the plated surfaces. This is particularly due to the oxides which tend to inhibit solder melting process later. Any other suitable depositing technique known in the art may also be utilized. The semiconductor die (11) is then secured to the lead frame (12) and connections are made by re-flowing the solder element layers (14). Die placement may be achieved using standard flip-chip border with ±1 mil (2.54 micrometers) accuracy. In effect, a gap (not shown) is formed between the semiconductor die (11) and the lead frame (12), and such gap height could advantageously be controlled. Instead of using under-fill of dielectric layer to fill the gap, the present invention proposes a single encapsulation process where the gap is filled with encapsulation material. This can be achieved using conventional mold equipment and mold compound (15). Such mold compound is advantageous used to reduce localized stress due to CTE mismatch. As discussed earlier, the proposed invention offer a viable option to Ball Grid Array (BGA) process to assembled low pin count semiconductor devices that are mechanically robust and also offers more feature per package in a miniaturized size.

While the preferred embodiments of the present invention have been described, it should be understood that various changes, adaptations and modifications may be made thereto.

It should be understood, therefore, that the invention is not limited to details of the illustrated invention shown in the figures and that variations in such minor details will be apparent to one skilled in the art.

What is claimed is:

1. A flip-chip-type method of attaching a semiconductor die (11) to a lead frame (12), comprising the steps of:

configuring said semiconductor die (11) with a plurality of predetermined electric contact points (10) so as to accommodate connection to lead fingers of said lead frame (12);

configuring discrete conductive element (13) over each of said predetermined electric contact points (10);

depositing solder element to form solder element layers (14) on said lead fingers, said solder element layers (14)

are arranged at locations that match with said discrete conductive elements (13); and securing said semiconductor die (11) to said lead frame (12) through said electric contact points (10), said discrete conductive elements (13) and said solder element layers (14), respectively.

2. A method as claimed in claim 1, wherein said solder element layers (14) are re-flowed to affect connection of said electric contact points (10) to said lead fingers.

3. A method as claimed in claim 2, wherein said solder element layers (14) are adapted to melt at a temperature lower than the melting temperature of said discrete conductive elements (13).

4. A method as claimed in claim 3, wherein a gap is formed between said secured semiconductor die (11) and lead frame (12).

5. A method as claimed in claim 1, wherein said formed gap including said secured semiconductor die (11) and said lead fingers are filled and encapsulated by an encapsulating material, respectively.

6. A method as claimed in claim 1, wherein said solder element is deposited on said lead fingers by stencil printing process.

7. A method as claimed in claim 1, wherein said solder element is deposited on said lead fingers by plating process.

8. A method as claimed in claim 1, wherein said solder element is deposited on said lead fingers using any suitable depositing process.

9. A method as claimed in claim 1, wherein localized stress caused by coefficient thermal expansion mismatch is substantially reduced.

10. A method as claimed in claim 2, wherein localized stress caused by coefficient thermal expansion mismatch is substantially reduced.

11. A method as claimed in claim 3, wherein localized stress caused by coefficient thermal expansion mismatch is substantially reduced.

12. A method as claimed in claim 4, wherein localized stress caused by coefficient thermal expansion mismatch is substantially reduced.

13. A method as claimed in claim 5, wherein localized stress caused by coefficient thermal expansion mismatch is substantially reduced.

14. A method as claimed in claim 6, wherein localized stress caused by coefficient thermal expansion mismatch is substantially reduced.

15. A method as claimed in claim 7, wherein localized stress caused by coefficient thermal expansion mismatch is substantially reduced.

16. A method as claimed in claim 8, wherein localized stress caused by coefficient thermal expansion mismatch is substantially reduced.

17. A method as claimed in claim 4, wherein said formed gap including said secured semiconductor die (11) and said lead fingers are filled and encapsulated by an encapsulating material, respectively.

18. A method as claimed in claim 17, wherein localized stress caused by coefficient thermal expansion mismatch is substantially reduced.

* * * * *